United States Patent
Wang et al.

(10) Patent No.: US 10,749,144 B2
(45) Date of Patent: Aug. 18, 2020

(54) DISPLAY SUBSTRATE AND METHOD FOR PREPARING THE SAME, AND DISPLAY DEVICE

(71) Applicant: BOE TECHNOLOGY GROUP CO., LTD., Beijing (CN)

(72) Inventors: Qing Wang, Beijing (CN); Shengji Yang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/399,875

(22) Filed: Apr. 30, 2019

(65) Prior Publication Data
US 2020/0075882 A1 Mar. 5, 2020

(30) Foreign Application Priority Data
Aug. 28, 2018 (CN) .......................... 2018 1 0987014

(51) Int. Cl.
| | |
|---|---|
| H01L 51/52 | (2006.01) |
| H01L 51/56 | (2006.01) |
| H01L 27/32 | (2006.01) |
| H01L 51/00 | (2006.01) |

(52) U.S. Cl.
CPC ........ *H01L 51/529* (2013.01); *H01L 27/3244* (2013.01); *H01L 51/5209* (2013.01); *H01L 51/56* (2013.01); *H01L 51/0048* (2013.01); *H01L 51/0097* (2013.01); *H01L 2227/323* (2013.01); *H01L 2251/301* (2013.01); *H01L 2251/5338* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 9,362,531 | B2 * | 6/2016 | Hong | .................. H01L 51/5246 |
| 2003/0201447 | A1 * | 10/2003 | Yamazaki | ........... H01L 33/0041 |
| | | | | 257/79 |
| 2005/0001247 | A1 | 1/2005 | Ozawa et al. | |
| 2012/0256528 | A1 | 10/2012 | Baisl | |
| 2014/0166994 | A1 * | 6/2014 | Xiong | ................. H01L 51/5246 |
| | | | | 257/40 |

(Continued)

FOREIGN PATENT DOCUMENTS

| | | |
|---|---|---|
| CN | 1551083 A | 12/2004 |
| CN | 102299265 A | 12/2011 |

(Continued)

OTHER PUBLICATIONS

First Office Action for Chinese Application No. 201810987014.5, dated Nov. 26, 2019, 9 pages.
CN102299265A, Machine Translation.

*Primary Examiner* — Grant S Withers
(74) *Attorney, Agent, or Firm* — Brooks Kushman P.C.

(57) ABSTRACT

Provided is a display substrate, a method for preparing the same, and a display device. The display substrate includes a plurality of display elements arranged on a base substrate and a heat dissipation layer arranged between the substrate and the plurality of display elements, in which an electrode of at least one of the plurality of display elements is connected to the heat dissipation layer via at least one heat conducting structure.

20 Claims, 4 Drawing Sheets

(56) References Cited

U.S. PATENT DOCUMENTS

| | | |
|---|---|---|
| 2017/0237034 A1 | 8/2017 | Gao |
| 2019/0043891 A1 | 2/2019 | Li et al. |
| 2019/0081123 A1 | 3/2019 | Wu et al. |
| 2019/0198802 A1* | 6/2019 | Lee .................... H01L 51/5012 |

FOREIGN PATENT DOCUMENTS

| | | |
|---|---|---|
| CN | 102687303 A | 9/2012 |
| CN | 103268885 A | 8/2013 |
| CN | 105609536 A | 5/2016 |
| CN | 107068724 A | 8/2017 |
| CN | 107634068 A | 1/2018 |
| CN | 207648562 U | 7/2018 |
| JP | 2014165039 A | 9/2014 |

\* cited by examiner

DISPLAY SUBSTRATE AND METHOD FOR PREPARING THE SAME, AND DISPLAY DEVICE

CROSS-REFERENCE TO RELATED APPLICATION

This application claims priority to Chinese Patent Application No. 201810987014.5 filed on Aug. 28, 2018, which is incorporated herein by reference in its entirety.

TECHNICAL FIELD

The present disclosure relates to the field of display technology, in particular, to a display substrate, a method for preparing the same and a display device.

BACKGROUND

The OLED (organic light-emitting diode) display device has the advantages of all solid state, active illumination, high brightness, high contrast, ultra-thin and ultra-light structure, low power consumption, no viewing angle limitation, wide operating temperature range, etc., and is considered as the next generation of new displays.

Each OLED display substrate may be considered as a display substrate composed of a plurality of integrated OLED structures. Each OLED structure is a heat source point when emitting light, and the heat productivity of the display substrate will increases as the brightness or area of the display substrate increases. An excessive temperature may affect the normal use of the display substrate. Therefore, the application of the existing OLED display substrate may be limited by the excessive temperature during use.

SUMMARY

In one aspect, the present disclosure provides a display substrate, including a plurality of display elements arranged on a base substrate and a heat dissipation layer arranged between the substrate and the plurality of display elements, in which an electrode of at least one of the plurality of display elements is connected to the heat dissipation layer via at least one heat conducting structure.

Optionally, an electrode of each display element is connected to the heat dissipation layer via at least one heat conducting structure.

Optionally, the plurality of display elements includes an anode layer, a cathode layer, and a light-emitting layer arranged between the anode layer and the cathode layer, and the anode layer of the plurality of display elements is connected to the heat dissipation layer via at least one heat conducting structure.

Optionally, the anode layer includes a plurality of anode patterns independent from each other, the plurality of anode patterns corresponds to the plurality of the display elements respectively, each anode pattern serves as an electrode of the corresponding display element, and a contact region between at least one heat conducting structure and the anode layer does not extend beyond the plurality of anode patterns.

Optionally, a first insulating layer, a second insulating layer, a third insulating layer, and a fourth insulating layer are formed between the base substrate and the electrode layer of the plurality of display elements, and the at least one heat conducting structure penetrates through the first insulating layer, the second insulating layer, the third insulating layer, and the fourth insulating layer and extends to the heat dissipation layer.

Optionally, the at least one of the plurality of heat conducting structures extends to the heat dissipation layer in a direction perpendicular to the base substrate.

Optionally, the heat dissipation layer is a transparent heat dissipation layer.

Optionally, at least one of the heat dissipation layer and the heat conducting structures is made of an insulating material.

Optionally, at least one of the heat dissipation layer and the at least one heat conducting structure is made of a diamond-like material or aluminum nitride, and the other one is made of graphene or a carbon nanotube.

Optionally, both the heat dissipation layer and the at least one heat conducting structure are made of a conductive material, and the heat conducting structures is electrically insulated from a layer of the conductive material by an insulating material.

Optionally, the heat dissipation layer has a thickness of 0.2 mm to 10 mm.

Optionally, the heat conducting structure is in contact with a side of the heat dissipation layer away from the base substrate; or a hole is formed in the heat dissipation layer, and the heat conducting structure extends into the hole and is in contact with an inner wall of the hole.

Optionally, a surface of the heat dissipation layer away from the base substrate is planarized.

Optionally, the heat dissipation layer is made of an insulating material, and the heat dissipation layer is formed on a side of a drain/source electrode away from the base substrate.

In another aspect, the present disclosure provides a display device including the above display substrate.

Optionally, the display device further includes a heat dissipation structure arranged at an edge of the heat dissipation layer and configured to dissipate the heat transferred to the heat dissipation layer.

In still another aspect, the present disclosure provides a method for preparing the above display substrate, including: providing a base substrate; forming a heat dissipation layer and at least one heat conducting structure on the base substrate; and forming a plurality of display elements on the heat dissipation layer, in which an electrode of at least one of the plurality of display elements is connected to the heat dissipation layer via at least one heat conducting structure.

DETAILED DESCRIPTION

The technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on these embodiments, a person skilled in the art may, without any creative effort, obtain the other embodiments, which also fall within the scope of the present disclosure.

In view of the technical problems in the related art, embodiments of the present disclosure provide a display substrate, a method for preparing the same, and a display device, which solve the problem that the related OLED display substrate may affect the use due to an excessive temperature.

According to an embodiment of the present disclosure, there is provided a display substrate, including a plurality of display elements arranged on a base substrate and a heat dissipation layer arranged between the substrate and the plurality of display elements, in which an electrode of at least one of the plurality of display elements is connected to the heat dissipation layer via at least one heat conducting structure.

In the display substrate according to the embodiments of the present disclosure, since the electrodes of the display elements are connected to the heat dissipation layer via the at least one heat conducting structure, the heat generated during the use of the electrode of the display elements can be transferred to the heat dissipation layer via the heat dissipation structure, be dissipated via the heat dissipation layer, and thus reduce the temperature of the display substrate, thereby reducing the possibility that the normal use of the display substrate is affected by an excessive temperature.

Figure 1:
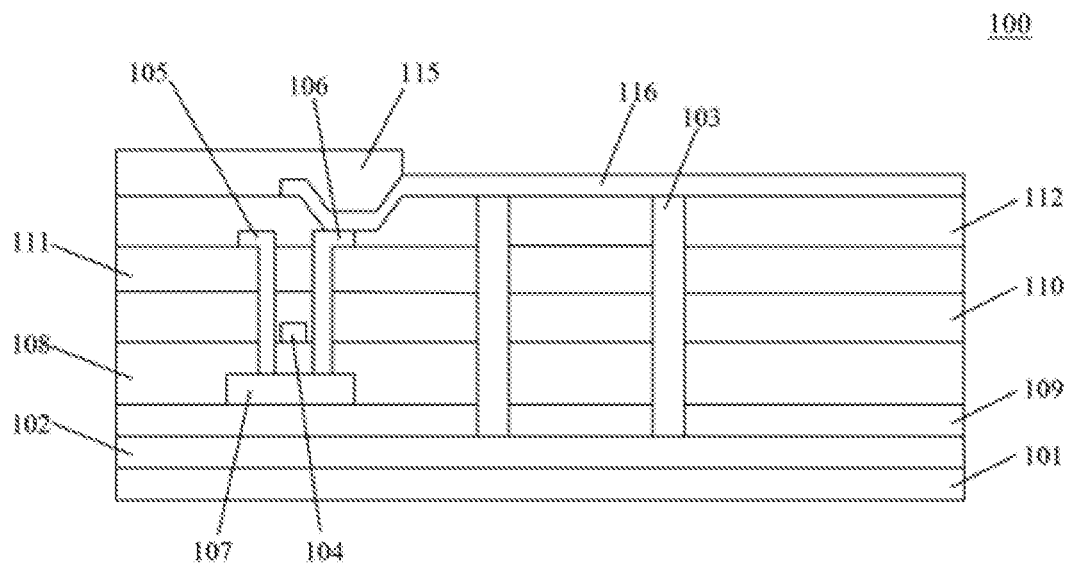
FIG. 1 is a structural view of a display substrate according to one embodiment of the present disclosure.

As shown in FIG. 1, an embodiment of the present disclosure provides a display substrate 100 including a heat dissipation layer 102, a heat conducting structure 103, and a plurality of display elements arranged on the substrate 101. The heat dissipation layer 102 in this embodiment is formed between the base substrate 101 and the plurality of display elements. Specifically, the heat dissipation layer 102 may be formed on the surface of the base substrate 101, and the heat dissipation layer 102 may be formed between other film layers. For example, a plurality of functional film layers may be further included between the plurality of display elements and the base substrate 101, and the heat dissipation layer 102 may also be formed between the plurality of functional film layers. The specific position of the heat dissipation layer 102 in this embodiment is not further limited, as long as it does not affect the normal display function of the plurality of display elements.

The heat dissipation layer 102 may be configured to cover the entire surface of the base substrate 101, that is, the heat dissipation layer 102 and the base substrate 101 are substantially the same in shape and size. The heat dissipation layer 102 may also be configured to cover only a portion of the base substrate 101. For example, in order to circumvent some other film structure or the like, the shape of the heat dissipation layer 102 is adjusted such that the heat dissipation layer 102 is not present in certain regions of the base substrate 101.

The heat conducting structure 103 is configured to transfer at least a portion of the heat generated during the operation of the electrodes of the display elements to the heat dissipation layer 102, thereby reducing the temperature of the electrodes during the operation.

In this embodiment, the heat conducting structure 103 and the heat dissipation layer 102 can be made of a material having a relatively high thermal conductivity, to improve the heat transfer effect. This is capable of improving the heat transfer efficiency, thereby achieving a reduction in the temperature of the display element.

The display substrate includes a plurality of display elements, each of which corresponds to a light-emitting diode. Each LED is equivalent to a small heat source during use. The heat generated during the operation of each of the display elements is transferred to the heat dissipation layer via the heat conducting structure, thereby reducing the temperature of the display elements during the operation.

Specifically, the display substrate 100 of the embodiment of the present disclosure is provided with the heat dissipation layer 102 and the heat conducting structure 103. An electrode of the at least one of the display elements is connected to the heat dissipation layer 102 via the heat conducting structure 103, and the heat generated during the use of the electrodes of the display elements can be transferred to the heat dissipation layer 102 via the heat dissipation structure and be dissipated via the heat dissipation layer 102. This is capable of reducing the temperature of the display substrate, and reducing the possibility that the normal use of the display substrate is affected by an excessive temperature.

In general, the excessive temperature of OLED display elements may affect its service life, and may even directly cause it to fail to display properly. Especially for a micro OLED display substrate (micro-OLED) applied to a mobile terminal, a head mounted device, etc., the excessive temperature thereof not only affects the normal display function but also affects the user experience. The heat dissipation layer 102 and the heat conducting structure 103 are arranged to dissipate the heat generated during the use of the display substrate, to ensure normal use of the display elements and improve user experience.

Further, in an optional embodiment, the electrode of each display element is connected to the heat dissipation layer 102 via a heat conducting structure 103. This arrangement enables a portion of the heat generated during the use of each display element to be transferred to the heat dissipation layer 102 via the heat conducting structure 103. This further enhances the heat dissipation effect and helps to reduce the temperature of the display elements.

Figure 2:
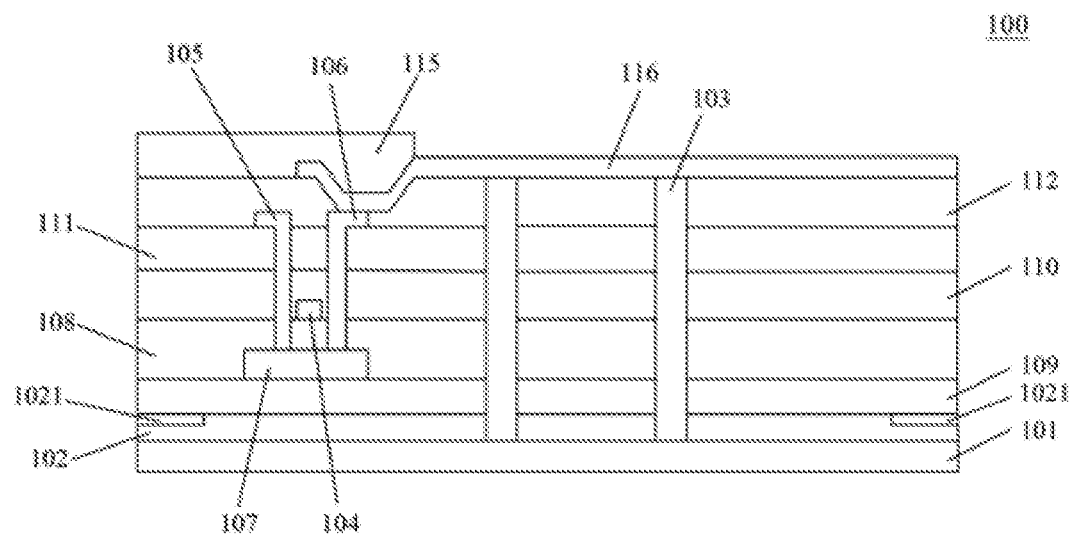
FIG. 2 is a structural view of a display substrate according to another embodiment of the present disclosure.
Figure 3:
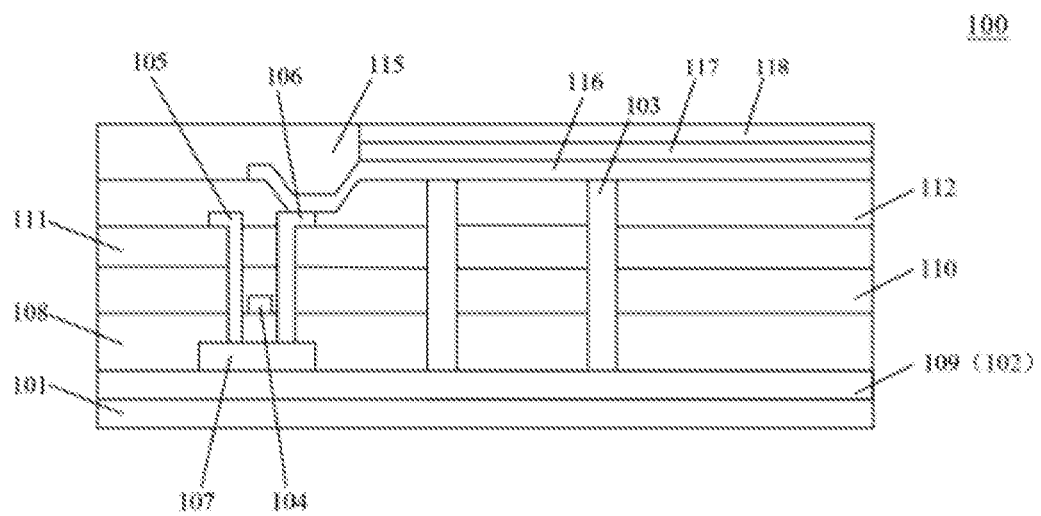
FIG. 3 is a structural view of a display substrate according to one yet embodiment of the present disclosure.

As shown in FIGS. 1 to 3, in an optional embodiment, a TFT structure and some other functional film layers are formed on the base substrate 101. The TFT structure includes a gate electrode 104, a source electrode 105, a drain electrode 106, a channel layer (active layer) 107, and a first insulating layer (gate insulating layer) 108. In addition, the functional film layer that needs to be formed includes, but is not limited to, various functional film layers, such as the overcoat 109, the second insulating layer 110, the third insulating layer 111, the fourth insulating layer (passivation layer) 112, and the pixel defining layer 115. The heat conducting structure 103 passes through the TFT structure and other functional film layers, to achieve the contact between the heat conducting structure and the heat dissipation layer.

Specifically, since the area covered by the first insulating layer 108, the second insulating layer 110, the third insulating layer 111, and the fourth insulating layer 112 is relatively large, the heat conducting structure 103 in this embodiment penetrates through the first insulating layer 108, the second insulating layer 110, the third insulating layer 111 and the fourth insulating layer 112, to extend to the heat dissipation layer 102. As for other structural or functional film layers such as the gate electrode 104, the source electrode 105/drain electrode 106, etc., the heat conducting structure 103 may penetrate through these structural or functional film layers as necessary, or these structural or functional film layers may be circumvented by adjusting the orientation of the heat conducting structure 103.

Optionally, the heat conducting structure 103 may extend to the heat dissipation layer 102 in a direction substantially perpendicular to the heat dissipation layer 102, or may extend obliquely to the heat dissipation layer 102 to circumvent certain functional film layers or structures on the display substrate.

Further, the display element includes an anode layer 116, a cathode layer 118, and a light-emitting layer 117 arranged between the anode layer 116 and the cathode layer 118, as shown in FIG. 3. A packing layer may also be formed on the display element. When a touch control function needs to be implemented, a touch layer can further be provided. The light-emitting layer may include a hole transport layer, a light-emitting material layer, an electron transport layer, and the like. The structure of the light-emitting layer is not further defined and described herein. The heat dissipation layer 102 is connected to the anode layer of the display element via at least one heat conducting structure 103.

The heat conducting structure 103 in this embodiment may be connected to the anode layer 116 of the display element to dissipate the heat of the anode layer 116, or may be connected to the cathode layer of the display element to dissipate the heat of the cathode layer. Generally, the resistivity of the material for the anode layer of the display element is greater than that of the material for the cathode layer. Further, the wiring on a side proximate to the base substrate 101 is also relatively large. Therefore, the temperature of the anode layer 116 of the display element is generally higher than the temperature of the cathode layer. Therefore, in the present embodiment, the heat conducting structure 103 is connected to the anode layer 116 of the display element, so that the temperature of the anode layer 116 can be reduced to make the temperature of the entire display substrate more uniform.

Further, the anode layer 116 includes a plurality of anode patterns independent from each other, and a contact region between at least one heat conducting structure 103 and the anode layer 116 is not greater than the area of the plurality of anode patterns.

Moreover, a contact region between the conducting structure 103 and the anode layer 116 does not extend beyond each anode pattern. When the heat conducting structure 103 is made of a conductive material, if the contact region between the heat conducting structure 103 and the anode layer 116 goes beyond the scope of each anode pattern, it may cause the short circuit between the two anode patterns in contact with the heat conducting structure 103.

Obviously, when the contact region between the heat conducting structures 103 and the anode layer 116 goes beyond the scope of each of the plurality of anode patterns, the short circuit between the anode patterns can be avoided by using the heat conducting structure 103 made of an insulating material or by insulation the portion between the heat conducting structure 103 and each anode pattern. By allowing the contact region between the heat conducting structures 103 and the anode layer 116 not extend beyond the plurality of anode patterns, it helps to simplify the process and reduces the limitation to the material of the heat conducting structure 103.

In addition, the heat conducting structures 103 is in full contact with the anode layer 116, to ensure a better heat dissipation effect. If the heat conducting structure 103 is outside the scope of the anode patterns, for example, if a portion of the heat conducting structure s103 corresponds to a gap between the anode patterns, a certain heat dissipation area may be wasted. Therefore, by allowing the contact region between the heat conducting structures 103 and the anode layer 116 not extend beyond the plurality of anode patterns, it also improves the utilization rate in the heat dissipation process of the heat conducting structures 103.

Figure 4:
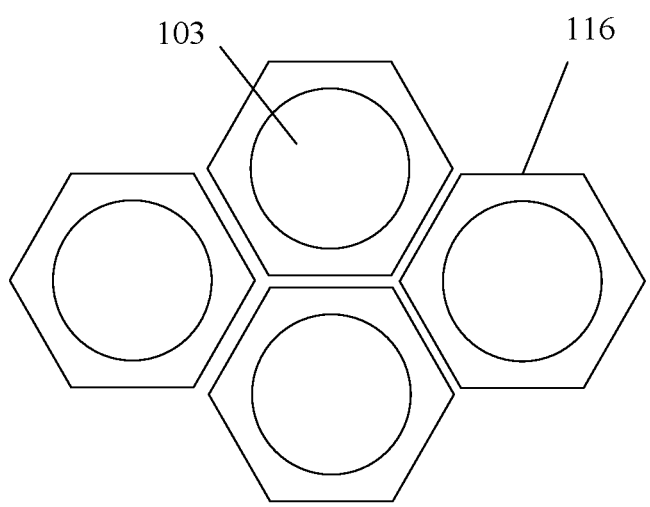
FIG. 4 is a schematic cross-sectional view showing a connection structure between an anode layer and a heat conducting structure according to one embodiment of the present disclosure.
Figure 5:
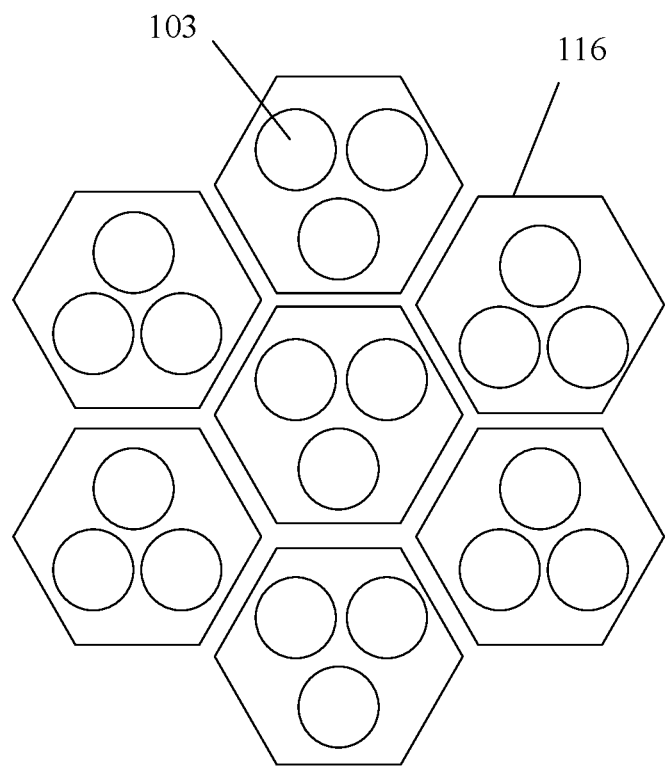
FIG. 5 is a schematic cross-sectional view showing a connection structure between an anode layer and a heat conducting structure according to another embodiment of the present disclosure.

The number of heat conducting structures 103 is set optionally. As shown in FIG. 4, one heat conducting structure 103 connected to the heat dissipation layer 102 may be provided for each anode pattern. As shown in FIG. 5, a plurality of heat conducting structures 103 connected to the heat dissipation layer 102 may be provided for each anode pattern. A portion of the anode pattern may be provided with one or more heat conducting structures 103, while a portion of the anode pattern is not provided with any heat conducting structure 103.

By controlling the number and position of the heat conducting structures 103, the heat dissipation effect and the manufacturing process can be adjusted. For example, reducing the number of heat conducting structures 103 helps to reduce the complexity of the process; and increasing the number of heat conducting structures 103 is beneficial to improve heat dissipation. Therefore, the number of the heat conducting structures 103 can be suitably selected according to practical applications.

Optionally, in the above embodiment, the heat dissipation layer 102 is a transparent heat dissipation layer. A transparent heat dissipation layer acting as the heat dissipation layer 102 can be achieved by controlling the material for the heat dissipation layer 102. For example, the selection of a transparent material to form the heat dissipation layer 102. A transparent heat dissipation layer acting as the heat dissipation layer 102 can also be achieved by controlling the thickness of the heat dissipation layer 102. For example, as for the same material, reducing its thickness helps to increase transparency.

When the display element is a top emission type display element, the heat dissipation layer 102 may not be a transparent heat dissipation layer. When the heat dissipation layer 102 is a transparent heat dissipation layer, it is applicable not only to a top emission type display element but also to a bottom emission type display element.

In a specific embodiment, the heat dissipation layer 102 may have a thickness of 0.2 mm to 10 mm. For example, it may be 0.2 mm, 1 mm, 10 mm, and other various values. By controlling the thickness of the heat dissipation layer 102, the light transmittance of the heat dissipation layer 102 can be increased, thereby increasing the display brightness of the display substrate; and avoiding occupying too much space and thus avoiding the display substrate to be too thick.

Optionally, at least one of the heat dissipation layer and the heat conducting structures is made of an insulating material. Optionally, at least one of the heat dissipation layer and the heat conducting structures is made of a diamond-like material or aluminum nitride, and the other one is made of graphene or a carbon nanotube. Optionally, both the heat dissipation layer and the heat conducting structures are made of a conductive material, and the heat conducting structures are electrically insulated from a layer of the conductive material by an insulating material.

Optionally, when the heat dissipation layer 102 includes a conductive material, the heat conducting structure 103 is made of an insulating material. In the present embodiment, the heat conducting structures 103 may be made of a metal material, such as copper, aluminum, or the like. In general, the thermal conductivity of the metal material is higher than those of the organic materials and inorganic materials commonly used in display substrates, and this it is advantageous for improving the heat dissipation effect. However, the metal material has a high coefficient of thermal expansion and may be deformed when heated, resulting in local stress concentration and defects in the display substrate.

In a specific embodiment, the heat dissipation layer 102 in the embodiment may be made of graphene or a carbon nanotube; and the heat conducting structures 103 are made of a diamond-like material or aluminum nitride. As compared with metal materials, diamond-like materials, graphene, a carbon nanotube or aluminum nitride have better mechanical properties when heated, and the degree of deformation is small, and stress concentration is less likely to occur, and thus they help to prevent defects in the display substrate.

In this embodiment, it is necessary to avoid short circuit between the anode patterns due to the provision of the heat dissipation layer 102 and the heat conducting structure 103. The materials such as graphene are all conductors. If the heat dissipation layer 102 and the heat conducting structure 103 are both graphene, the anode patterns are electrically connected via the heat conducting structure 103 and the heat dissipation layer 102, which affects normal use. In this embodiment, an insulating layer can be arranged between the heat conducting structure 103 and the heat dissipation layer 102. For example, if the heat dissipation layer 102 is made of graphene and the heat conducting structure 103 is made of a carbon nanotube, then an insulating layer made of a diamond-like material may be arranged between the heat conducting structure 103 and the heat dissipation layer 102, or an insulating layer made of a diamond-like material may be arranged between the heat conducting structure 103 and the anode pattern. This can avoid the conductive short circuit of each anode pattern. Obviously, the insulating layer can also be made of other insulating materials having a higher thermal conductivity.

In order to simplify the process, in the embodiment, when one of the heat dissipation layer 102 and the heat conducting structure 103 is a conductive material, the other one is an insulation material. For example, when the heat dissipation layer 102 includes a conductive material, the heat conducting structure 103 is made of an insulating material; and when the heat dissipation layer 102 is an insulating material, the heat conducting structure 103 can be either a conductive material or an insulating material. By selecting the corresponding material to form the heat dissipation layer 102 and the heat conducting structure 103, it is possible to avoid short circuit between the anode patterns, and it is not necessary to form an insulating layer between the anode patterns, which contributes to simplifying the production process.

In addition, in order to avoid the short circuit between the other functional film layers due to the heat-conducting structures 103, it can be achieved by controlling the orientation of the heat conducting structure 103. For example, the orientation of the heat conducting structure 103 is controlled to circumvent the pattern structure of certain film layers.

Further, the heat conducting structure 103 and the heat dissipation layer 102 may be interconnected by wires, or may be interconnected by via holes. Specifically, as shown in FIGS. 1 and 3, the expression "being interconnected by wires" means that the thermal structure 103 is in contact with a side surface of the heat dissipation layer 102 away from the base substrate 101, thereby achieving a heat dissipation effect. As shown in FIG. 2, the expression "being interconnected by via holes" means that a via hole is formed in the heat dissipation layer 102, in which the heat conducting structure 103 extends into the via hole and is in contact with the inner wall of the via holes, thereby connecting the heat conducting structure 103 to the heat dissipation layer 102.

Further, the heat dissipation layer 102 further serves as an overcoat 109 or a passivation layer 112 of the display substrate, as shown in FIG. 3.

The heat dissipation layer 102 in this embodiment can also further serve as the overcoat 109 or the passivation layer 112 of the display substrate. The main difference between the overcoat 109 or the passivation layer 112 in this embodiment and the existing overcoat 109 or passivation layer 112 is that when the overcoat 109 or the passivation layer 112 is formed, an insulating material having relatively high thermal conductivity is selected. The anode layer 116 of the display element is connected to the overcoat 109 or passivation layer 112 via the heat conducting structure 103.

As shown in FIG. 2, after the heat dissipation layer 102 is formed, the surface of the heat dissipation layer 102 is planarized. The specific manners and steps of the planarization process can be referred to the prior art, and are not further limited herein.

After the surface of the heat dissipation layer 102 is planarized, the step of providing the original overcoat may be omitted, and the heat dissipation layer 102 may also serve as the overcoat 109 of the display substrate.

In another embodiment, the heat dissipation layer 102 is formed of an insulating material, and the heat dissipation layer 102 is formed on a side of the drain layer 105 and the source layer 106 away from the substrate. As for its specific position, please refer to the above position of the four insulating layers (passivation layer) 112. At this time, the heat dissipation layer 102 is capable of functioning as the passivation layer 112 in the original display substrate, and thus the passivation layer 112 can be omitted. That is, the heat dissipation layer 102 further serves as the passivation layer 112 of the display substrate.

By serving the heat dissipation layer 102 as the overcoat 109 or the passivation layer 112 of the display substrate, it is helpful to simplify the production process, reduce the complexity of the structure of the display substrate, and at the same time, also generate the effect of dissipating the heat generated during the operation of the electrodes of the display elements.

Figure 7:
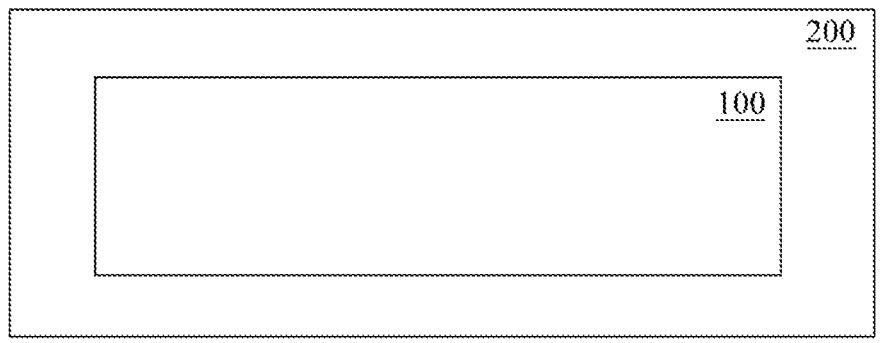
FIG. 7 is a structural view of a display device including the display substrate according to an embodiment of the present disclosure.

The present disclosure also provides a display device 200 including any of the above display substrates 100, as shown in FIG. 7. The technical solutions of the present embodiment include all the technical solutions of the foregoing display substrate embodiments, so that at least the above technical effects can be achieved, which is not described herein again.

The display device may include at least one of a mobile phone, a tablet computer, an e-book reader, an MP3 player, an MP4 player, a digital camera, a laptop portable computer, a car computer, a desktop computer, a set top box, a smart TV, and a wearable device.

Optionally, the heat dissipation structure 1021 is further arranged in the embodiment, the heat dissipation structure 1021 is arranged on an edge of the heat dissipation layer 102, as shown in FIG. 2, and the heat dissipation structure 1021 is configured to dissipate the heat transferred to the heat dissipation layer 102.

Optionally, the heat dissipation structure in this embodiment may be a heat dissipation fin. For example, a plurality of heat dissipating fins are arranged at the edge of the heat dissipation layer 102, to increase the heat dissipation rate of the heat dissipation layer 102 by increasing the heat dissipation area. The heat dissipating fins may be arranged to abut against the heat dissipation layer 102, or may be arranged to extend to the inside of the heat dissipation layer 102, to improve heat conduction efficiency.

Optionally, the heat dissipation structure in this embodiment may also be a heat dissipation pipe, which may be an air-cooled or liquid-cooled heat dissipation pipe. In one embodiment, an air flow passage may be provided at the edge of the heat dissipation layer 102, to take away heat transferred to the heat dissipation layer 102 by air flow. In another specific embodiment, a water flow channel may be provided at the edge of the heat dissipation layer 102, to take away heat transferred to the heat dissipation layer 102 by the cooling water during the circulation.

Figure 6:
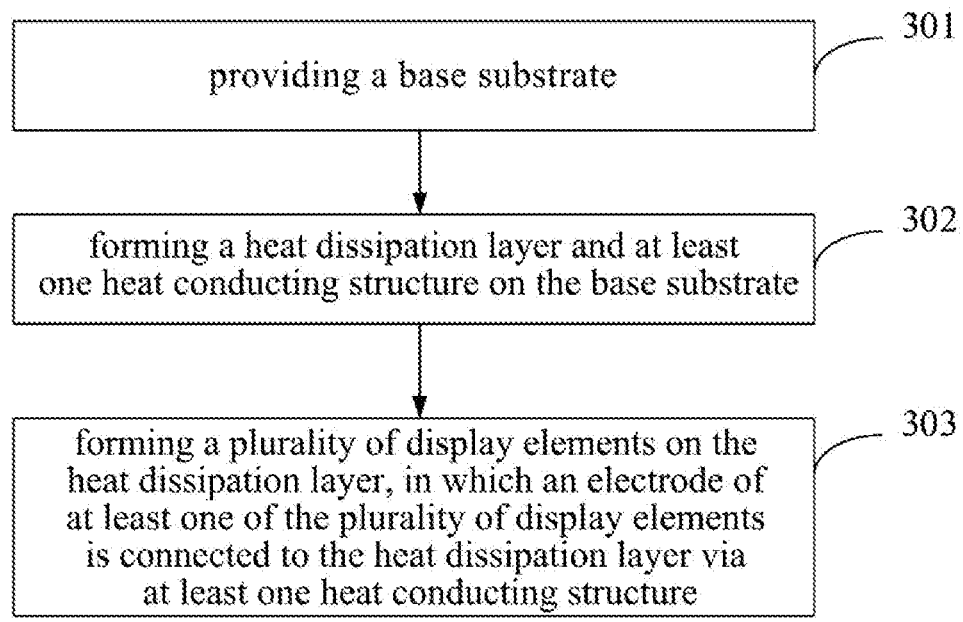
FIG. 6 is a flow chart showing a method for preparing a display substrate according to one embodiment of the present disclosure.

Embodiments of the present disclosure also provide a method for preparing a display substrate, as shown in FIG. 6, in which the method includes the following steps 301 to 303.

Step 301: providing a base substrate.

The base substrate 101 in this embodiment may be a flexible substrate, e.g., a flexible substrate made of polyimide (PI); or may be a non-flexible substrate, e.g., a base substrate 101 made of glass or the like. This is not further defined here.

Step 302: forming a heat dissipation layer and at least one heat conducting structure on the base substrate.

Further, a heat dissipation layer 102 is formed on the base substrate 101. The heat dissipation layer 102 is made of a material having a relatively high thermal conductivity, thereby better utilizing the heat dissipation layer 102 to absorb and transfer heat generated during the operation of the display elements.

The heat dissipation layer 102 can be made of a transparent material, and is capable of further improving the light transmittance of the display substrate, thereby improving the display brightness of the display substrate. The material of the heat dissipation layer may specifically be diamond-like, aluminum nitride, graphene or the like.

In some specific embodiments, the heat dissipation layer 102 can also serve as an overcoat 109 or a passivation layer 112. When the heat dissipation layer 102 is also serve as an overcoat 109 or a passivation layer 112, the step of forming the heat dissipation layer 102 may be referred to the existing steps of producing the overcoat 109 or the passivation layer 112, and mainly differs from the existing steps of producing the overcoat 109 or the passivation layer 112 in that the material used is a material having a relatively high thermal conductivity.

Taking the heat dissipation layer 102 as an overcoat 109 as an example, after the heat dissipation layer 102 is formed, the heat dissipation layer is planarized, such that the heat dissipation layer 102 can also serve as the overcoat 109. This preparation step helps to simplify the production process.

The position of the heat dissipation layer 102 can be adjusted, and the heat dissipation layer can be directly formed on the surface of the base substrate 101 or on other film layers on the base substrate 101. Specifically, when the heat dissipation layer 102 also serves as the passivation layer 112, the heat dissipation layer 102 is formed at each position where the passivation layer 112 needs to be formed; and when the heat dissipation layer 102 also serves as the overcoat 109, the heat dissipation layer 102 may also be formed on the base substrate 102 or other position where the overcoat 109 needs to be formed.

Correspondingly, the step of forming the heat dissipation layer 102 may be performed before the step of forming the TFT structure or alternated with the step of forming the TFT structure, and may be adjusted according to the position of the heat dissipation layer 102, which is not further limited herein.

Step 303: forming a plurality of display elements on the heat dissipation layer, in which an electrode of at least one of the plurality of display elements is connected to the heat dissipation layer via at least one heat conducting structure.

When the display element is formed, the electrodes of the display elements are in contact with the heat conducting structures 103. Specifically, the anode layer 116 of the display element is formed at a corresponding position of each of the heat conducting structures 103 such that the anode pattern is connected to the corresponding heat conducting structure 103. The heat conducting structure 103 dissipates the heat generated during the operation of the display element.

The display substrate prepared by the method for preparing the display substrate has a heat dissipation layer 102 and a heat conducting structure 103. The electrodes of the display elements are connected to the heat dissipation layer 102 via the heat conducting structure 103. The heat dissipated during the use of the electrodes of the display elements can be transferred to the heat dissipation layer 102 via the heat dissipation structure and be dissipated via the heat dissipation layer 102. This is capable of reducing the temperature of the display substrate, and reducing the possibility that the use of the display substrate is affected by an excessive temperature.

The above is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A display substrate, comprising a plurality of display elements arranged on a base substrate and a heat dissipation layer arranged between the base substrate and the plurality of display elements, wherein an electrode of at least one of the plurality of display elements is connected to the heat dissipation layer via at least one heat conducting structure, wherein the at least one heat conducting structure extends through an opening from a position adjacent the electrode to a position adjacent the heat dissipation layer, and wherein the at least one heat conducting structure is formed of dielectric material.

2. The display substrate of claim 1, wherein an electrode of each display element is connected to the heat dissipation layer via at least one heat conducting structure.

3. The display substrate of claim 1, wherein the plurality of display elements comprises an anode layer, a cathode layer, and a light-emitting layer arranged between the anode layer and the cathode layer, and the anode layer of the plurality of display elements is connected to the heat dissipation layer via the at least one heat conducting structure.

4. The display substrate of claim 3, wherein the anode layer comprises a plurality of anode patterns independent from each other, the plurality of anode patterns corresponds to the plurality of the display elements respectively, each anode pattern serves as an electrode of the corresponding display element, and a contact region between the at least one heat conducting structure and the anode layer does not extend beyond the plurality of anode patterns.

5. The display substrate of claim 1, wherein a first insulating layer, a second insulating layer, a third insulating layer, and a fourth insulating layer are formed between the base substrate and the electrode layer of the plurality of display elements, and the at least one heat conducting structure penetrates through the first insulating layer, the second insulating layer, the third insulating layer, and the fourth insulating layer and extends to the heat dissipation layer.

6. The display substrate of claim 1, wherein the at least one heat conducting structure extends to the heat dissipation layer in a direction perpendicular to the base substrate.

7. The display substrate of claim 1, wherein the heat dissipation layer is a transparent heat dissipation layer.

8. The display substrate of claim 1, wherein the heat dissipation layer is made of an insulating material.

9. The display substrate of claim 8, wherein the at least one heat conducting structure is made of a diamond-like material or aluminum nitride, and the heat dissipation layer is made of graphene or a carbon nanotube.

10. The display substrate of claim 1, wherein the heat dissipation layer is made of a conductive material.

11. The display substrate of claim 1, wherein the heat dissipation layer has a thickness of 0.2 µm to 10 µm.

12. The display substrate of claim 1, wherein the at least one heat conducting structure is in contact with a side of the heat dissipation layer away from the base substrate; or
   a hole is formed in the heat dissipation layer, and the at least one heat conducting structure extends into the hole and is in contact with an inner wall of the hole.

13. The display substrate of claim 1, wherein a surface of the heat dissipation layer away from the base substrate is planarized.

14. The display substrate of claim 1, wherein the heat dissipation layer is made of an insulating material, and the heat dissipation layer is formed on a side of a drain/source electrode away from the base substrate.

15. A display device, comprising the display substrate of claim 1.

16. The display device of claim 15, further comprising a heat dissipation structure arranged at an edge of the heat dissipation layer and configured to dissipate the heat transferred to the heat dissipation layer.

17. The display device of claim 15, wherein an electrode of each display element is connected to the heat dissipation layer via the at least one heat conducting structure.

18. The display device of claim 15, wherein the plurality of display elements comprises an anode layer, a cathode layer, and a light-emitting layer arranged between the anode layer and the cathode layer, and the heat dissipation layer is connected to the anode layer of the plurality of display elements via the at least one heat conducting structure.

19. The display device of claim 18, wherein the anode layer comprises a plurality of anode patterns independent from each other, the plurality of anode patterns corresponds to the plurality of the display elements respectively, each anode pattern serves as an electrode of the corresponding display element, and a contact region between the at least one heat conducting structure and the anode layer does not extend beyond the plurality of anode patterns.

20. A method for preparing a display substrate, comprising:
   providing a base substrate;
   forming a heat dissipation layer and at least one heat conducting structure on the base substrate; and
   forming a plurality of display elements on the heat dissipation layer, wherein an electrode of at least one of the plurality of display elements is connected to the heat dissipation layer via the at least one heat conducting structure;
   wherein the at least one heat conducting structure extends through an opening from a position adjacent the electrode to a position adjacent the heat dissipation layer, and wherein the at least one heat conducting structure is formed of dielectric material.

* * * * *